(12) United States Patent
Nadathur et al.

(10) Patent No.: US 12,292,791 B2
(45) Date of Patent: May 6, 2025

(54) SYSTEMS AND METHODS FOR ISOLATING AN ACCELERATED FUNCTION UNIT AND/OR AN ACCELERATED FUNCTION CONTEXT

(71) Applicant: Intel Corporation, Santa Clara, CA (US)

(72) Inventors: Sundar Nadathur, Cupertino, CA (US); Pratik M. Marolia, Hillsboro, OR (US); Henry M. Mitchel, Wayne, NJ (US); Joseph J. Grecco, Saddle Brook, NJ (US); Utkarsh Y. Kakaiya, Folsom, CA (US); David A Munday, Santa Cruz, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 18/622,897

(22) Filed: Mar. 30, 2024

(65) Prior Publication Data
US 2024/0248792 A1 Jul. 25, 2024

Related U.S. Application Data

(63) Continuation of application No. 17/723,383, filed on Apr. 18, 2022, now Pat. No. 11,966,281, which is a continuation of application No. 15/940,779, filed on Mar. 29, 2018, now Pat. No. 11,307,925.

(51) Int. Cl.
G06F 11/00 (2006.01)
G06F 11/07 (2006.01)

(52) U.S. Cl.
CPC ...... *G06F 11/0793* (2013.01); *G06F 11/0706* (2013.01); *G06F 11/0721* (2013.01); *G06F 11/0751* (2013.01)

(58) Field of Classification Search
CPC ............. G06F 11/0721; G06F 11/0751; G06F 11/0793; G06F 11/0706
See application file for complete search history.

(56) References Cited

U.S. PATENT DOCUMENTS

| | | |
|---|---|---|
| 2015/0317274 A1 | 11/2015 | Arroyo et al. |
| 2017/0123684 A1 | 5/2017 | Albot et al. |
| 2017/0123690 A1 | 5/2017 | Albot et al. |
| 2017/0132083 A1 | 5/2017 | Aslot et al. |
| 2017/0132163 A1 | 5/2017 | Aslot et al. |
| 2018/0239665 A1 | 8/2018 | Hutton et al. |
| 2019/0147342 A1 | 5/2019 | Goulding et al. |
| 2019/0165782 A1 | 5/2019 | Zhao et al. |
| 2019/0188066 A1 | 6/2019 | Mody et al. |
| 2020/0229206 A1 | 7/2020 | Badic et al. |

*Primary Examiner* — Joshua P Lottich
(74) *Attorney, Agent, or Firm* — Fletcher Yoder, P.C.

(57) ABSTRACT

Systems, methods, and devices for isolating a misbehaving accelerator circuit, such as an accelerator function unit or an accelerated function context, are provided. An integrated circuit may include a region that includes an accelerator circuit. When the accelerator circuit issues a request, another region of the integrated circuit or a processor connected to the integrated circuit may determine whether there is a misbehavior associated with the request and, in response to determining that there is a misbehavior associated with the request, may perform a misbehavior response to mitigate a negative impact of the misbehavior of the accelerator circuit.

20 Claims, 3 Drawing Sheets

FIG. 1

SYSTEMS AND METHODS FOR ISOLATING AN ACCELERATED FUNCTION UNIT AND/OR AN ACCELERATED FUNCTION CONTEXT

CROSS-REFERENCE TO RELATED APPLICATIONS

This application is a continuation of U.S. application Ser. No. 17/723,383, filed Apr. 18, 2022, entitled "Systems and Methods for Isolating an Accelerated Function Unit or an Accelerated Function Context," which is a continuation of U.S. application Ser. No. 15/940,779, filed Mar. 29, 2018, entitled "Systems and Methods for Isolating an Accelerated Function Unit or an Accelerated Function Context," which is hereby incorporated by reference in its entirety for all purposes.

BACKGROUND

The present disclosure relates generally to securing integrated circuits, such as field-programmable gate arrays (FPGAs). More particularly, the present disclosure relates to isolating certain areas of circuitry of programmable logic, such as accelerated function units (AFUs) or accelerated function contexts (AFCs), to prevent erroneous behavior from those areas.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Modern electronics such as computers, portable devices, network routers, data centers, Internet-connected appliances, and more, tend to include at least one integrated circuit device. Integrated circuit devices take a variety of forms, including processors, memory devices, and programmable devices, to name only a few examples. An FPGA is one type of programmable device that utilizes integrated circuits. Programmable devices may include logic that may be programmed (e.g., configured) after manufacturing to provide a wide variety of functionality based on various designs possible within the programmable devices. Thus, programmable devices contain programmable logic (e.g., logic blocks) that may be configured and reconfigured to perform a variety of functions on the devices, according to a configured design.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. An accelerator, which may be referred to as an accelerator function unit, may include a number of individual components, which may be referred to as accelerator function contexts. Because an accelerated function unit and/or its accelerated function contexts may include user programs designed by an entity other than a programmable logic device owner or manufacturer, the programmable logic device owner or manufacturer may not know in advance how the accelerated function unit and its accelerated function contexts may behave in some runtime environments. When the accelerated function unit or its accelerated function contexts behave in certain unexpected or erroneous ways, such misbehavior could negatively impact other functions implemented on the programmable logic device.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, a programmable device (e.g., an FPGA) may contain different regions, or partitions, that may be configured by user programs designed by an entity other than a programmable logic device owner or manufacturer. It should be understood that references to configuration regions of the programmable device may include any suitable form of configuration, including, but not limited to, partial reconfiguration. Moreover, although some of the following descriptions describe different regions as a static region and a partial reconfiguration region, which represent a particular embodiment, it should be noted that the methods and systems may be performed and implemented in any suitable arrangement of regions, such as a programmable device having regions that are all static, all partially reconfigurable, etc.

Figure 1:
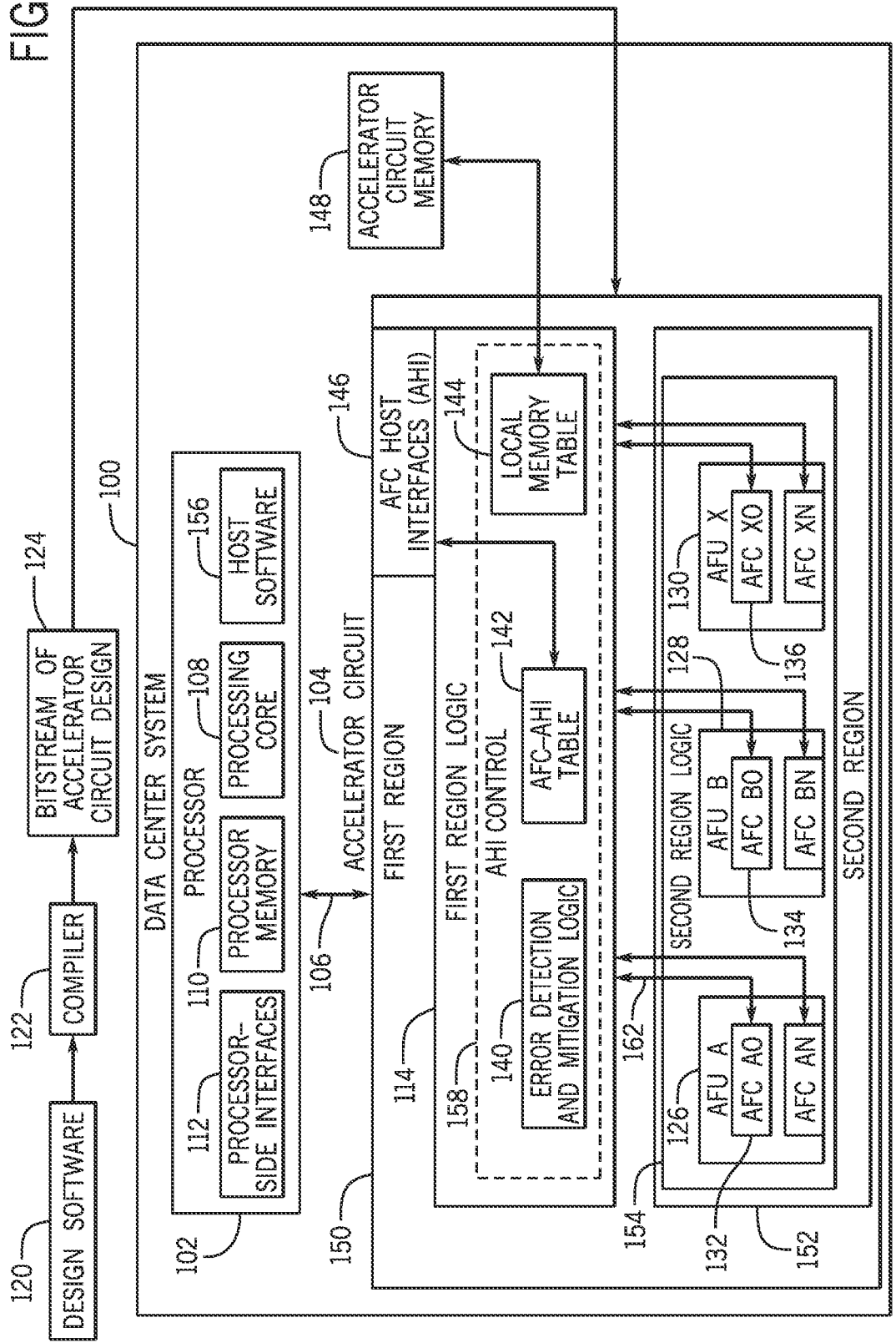
FIG. 1 is a block diagram of a system that may isolate certain circuitry of a programmable logic device to protect against a misbehavior, in accordance with an embodiment of the present disclosure.

With the foregoing in mind, FIG. 1 illustrates a block diagram of a data center system 100 that may isolate certain circuitry of a programmable logic device to protect against a misbehavior, in accordance with an embodiment of the present disclosure. The data center system 100 may include a processor 102 and an accelerator circuit 104 that are communicatively coupled through any suitable interconnect path(s) 106.

The processor 102 may be a hardware processor such as a central processing unit (CPU) that includes one or more processing cores 108 that may execute system software and/or user application software. Accelerator circuit 104 may include circuitry of one or more field-programmable gated arrays (FPGAs), application-specific integrated circuits (ASICs), or circuits composed of small processing cores (e.g., general-purpose computing on graphics processing units (GPGPUs)). For example, the accelerator circuit 104 may be formed from circuitry of one or more FPGAs. As such, for the purposes of this disclosure, the accelerator circuit 104 may be referred to as the FPGA 104, though any suitable circuitry and/or logic used to implement the accelerator circuit 104.

A designer may specify a program (e.g., a bitstream of an accelerator circuit design 124) that provides programming instructions to implement a set of programmable logic for the accelerator circuit 104 (e.g., configure one or more FPGA regions). In some instances, the designer may partially reconfigure a region of the accelerator circuit 104. There may be rules for an accelerator circuit 104 defined in a specification for how an accelerator circuit 104 may behave. For example, a specification for an accelerator circuit on a shared programmable logic device might not allow a designer to make an accelerator circuit that sends spam or that contains malware.

The processor 102 may further include a processing core 108 to execute software applications. Each software application during execution may be associated with a privilege level. The highest privilege level may be assigned to components of the kernel, and the memory space associated with the kernel is referred to as the kernel space. The lowest privilege level may be assigned to user applications, and the memory associated with the user application is referred to as the user space. During the operation of processor 102, processes of software applications with higher privilege levels may access the memory space of the lower privilege levels. The processor 102 may include processor-side interfaces 112 for software applications running on the processing core 108 to interact with hardware components associated with the processor 102. The processor-side interfaces 112 may also interact with the processor memory 110.

The designer may implement a design using design software 120, such as a version of Intel® Quartus® by Intel® Corporation. The design software 120 may use a compiler 122 to convert the design into a program. The compiler 122 may provide machine-readable instructions representative of the program to the processor 102 and the accelerator circuit 104. For example, the accelerator circuit 104 may receive one or more kernel programs which describe the hardware implementations that should be stored in the accelerator circuit 104. The processor 102 may receive a processor program from the compiler 122, which may be implemented by the kernel programs. To implement the processor program, the processor 102 may communicate instructions from the processor program to the accelerator circuit 104 via the interconnect path 106, which may be, for example, a direct memory access (DMA) communications path or a peripheral component interconnect express (PCIe) communications path. The PCIe path may implement packet-based protocol for information transfer. A physical function (PF) may be, for example, a PCIe function that supports an input/output virtualization interface.

In some embodiments, the kernel programs and the processor 102 may configure a partition (e.g., region) of the accelerator circuit 104. The regions on the accelerator circuit 104 may be configured with adaptable logic that may enable functionality to be added, removed, and/or swapped before and/or during the runtime of the accelerator circuit 104. The accelerator circuit 104 may include multiple regions, such as a first region 150 and a second region 152. The first and second regions 150, 152 may be any combination of static and partially reconfigurable regions. For example, the first region 150 may be a static region and the second region 154 may be a partially reconfigurable region.

A partial reconfiguration region may be modified (e.g., partially reconfigured) during runtime of the FPGA while the functionality of a static region may be fixed. Because its functionality is fixed, the static region of the FPGA may function as and/or be a component of a host for an accelerator (e.g., an accelerated function unit and/or accelerated function context). The accelerator may be within the partial reconfiguration region, and as such, the static region may offload, and therefore accelerate, certain functions of the FPGA onto the partial reconfiguration region such that they are performed separately from the static region. Additionally or alternatively, an accelerator may reside in a static region.

A static region may represent any region that does not change when another region (a partial reconfiguration region) is reconfigured. For example, the first region 150 may be a static region that may maintain the same configuration while the second region 152 may be a partial reconfiguration region that is reconfigured many different times. In other cases, at a first time, the first region 152 may be a static region while the second region 152 is a partial reconfiguration region that is reconfigured, but at a second time, the second region 152 may be a static region that maintains its same configuration while the first region 150 may be a partial reconfiguration region that is reconfigured. In other words, whether a region 150, 152 is a static region or a partial reconfiguration region may vary depending on whether the region 150, 152 maintains a configuration while another region is reconfigured. As illustrated in FIG. 1, in some embodiments, one region (e.g., the second region 152) may be wholly contained within another (e.g., the first region 150). However, this depicted arrangement is used as an example, and any suitable arrangement of regions is contemplated, such as two wholly distinct regions, two regions that overlap, etc.

Further, while the FPGA 104 may separate functionality to different regions (e.g., 150, 152), the regions 150, 152 may communicate with one another. Thus, an interface 162 may facilitate communication between regions on the FPGA. The interface 162 may include a physical wire interface that may restrict the use of certain wires to input or output data transfer functions (e.g., physical wire interface), and the interface 162 may further include a logical protocol interface that may use communication standards to transfer data. These protocols may include Avalon Memory Mapped Interface (Avalon-MM), Avalon Streaming Interface (Avalon-ST), Advanced Extensible Interface (AXI), or Core Cache Interface (CCI-P), to name just a few.

Each region 150, 152 may also implement certain logic configurations that may include images from various vendors (e.g., first-party and third-party configurations). As such, regions 150, 152 with compatible interfaces and logic configurations (e.g., compatible physical wire interfaces, compatible logical protocol interfaces, and compatible logic configurations) may successfully communicate with one another. However, while the physical wire interface and logical protocol interfaces of a region 150, 152 may be kept static (e.g., fixed) during operation, the static region logic and partial reconfiguration logic configurations may vary (e.g., once partial reconfiguration of the partial reconfiguration region occurs). When communicating with each other, the logical protocol interface (e.g., Core Cache Interface (CCI-P)) communicates by sending packets of data. A partial reconfiguration region logic may be configured with a third-party image (while the static region logic is configured with a first-party image. Thus, a partial reconfiguration region logic configured with a third-party image and static region logic with a first-party image may be unable to properly communicate if the logical protocol interface packet(s) and local memory request(s) originating from the accelerated function unit (e.g., AFU A 126, AFU B 128, AFU X 130) or accelerated function contexts (e.g., AFC A0 132, AFC B0 134, AFC X0 136) in the partial reconfiguration region are not in compliance as excepted for a packet format. As such, a static region logic or a host software 156 may detect a misbehaving accelerator (e.g., accelerated function unit) (e.g., AFU A 126, AFU B 128, AFU X 130) and/or accelerated function context (e.g., AFC A0 132, AFC B0 134, AFC X0 136)) in the partial reconfiguration region configured with an incompatible partial reconfiguration region logic, isolate the accelerator, and take appropriate action Turning back to the first region 150 and the second region 152, the compiler 122 may generate a bitstream of an accelerator circuit design 124 that may be executed by the processor 102 to program the accelerator circuit 104 (e.g., an FPGA) to generate accelerator function units, such as, AFU A 126, AFU B 128, AFU X 130, in the second region 152. The second region 152 includes at least one (e.g., AFU A 126) and up to X number (e.g., more than one, AFU X 130) of accelerated function units. The accelerated function units may contain at least one corresponding accelerator function contexts, AFC A0 132, AFC B0 134, AFC X0 136, and up to N (e.g., more than one, AFC AN, AFC BN, AFC XN) accelerated function contexts.

The first region 150 of the accelerator circuit 104 may include a first region logic 114, which may include an AFC Host Interface (AHI) Control 158. The AHI Control 158 may include an error detection and mitigation logic 140, an AFC-AHI Table 142, and a local memory table 144. The error detection and mitigation logic 140 may be used to check accelerated function unit (e.g., AFU A 126) and/or accelerated function context (e.g., AFC A0 132) compliancy and rule check for logical protocol interface transaction(s) (e.g., CCI-P request(s)) originating in the accelerated function units 126 and/or accelerated function contexts 132. As illustrated, the accelerated function unit 126 or the accelerated function context 132 each may be associated with a respective region slot identification (e.g., number, code, or the like). Each region may be translated to a unique AFC Host Interface value that corresponds to the specific accelerated function unit 126 and/or accelerated function context 132. Additionally, there may be a mapping from the slot identification and associated accelerated function unit 126 and/or accelerated function context 132 to memory segments (e.g., starting memory address and length) of the accelerator circuit memory 148, such that the segment identifies a particular region of memory. The relationship among accelerated function units 126 and/or accelerated function contexts 132 and memory segments may be many-to-many, such that one accelerated function unit 126 or accelerated function context 132 may be associated with multiple memory segments, and a memory segment may be shared among accelerated function units 126 and/or accelerated function contexts 132. Furthermore, segments may have other attributes including access permissions (e.g., read, write, etc.) and associated metadata (e.g., tags). These attributes may be used, alone or in addition to other features of communication from the accelerated function units 126 and/or accelerated function contexts 132, to identify whether the accelerated function units 126 and/or accelerated function contexts 132 are attempting to perform a disallowed misbehavior.

The accelerated function units 126 and/or accelerated function contexts 132 may be individually identified as slot identification values, such as indicating a slot or a sub-region on the FPGA 104. The AFC-AHI Table 142 may then translate the slot identification value to an AFC Host Interface (AHI) value that may be used by the AFC Host Interface 146. The AHI values that may be used by the AFC Host Interface 146 in the first region logic 114 enable interfacing and communicating with the first region logic 114 and host software 156. The accelerated function units 126 and/or accelerated function contexts 132 may request access to the local memory table 144, which may be located within the first region logic 114. The first region logic 114 may be coupled to an accelerator circuit memory 148. In some embodiments, as illustrated, the accelerator circuit memory 148 may be external to the accelerator circuit 104, and may not be communicatively coupled with the host (e.g., the processor 102). When an accelerated function unit 126 and/or accelerated function context 132 misbehaves, it may be isolated automatically and prevented from interacting with the first region logic 114, the local memory table 144, or the host (e.g., processor 102). Moreover, although the following descriptions describe the accelerated function units 126 and/or accelerated function contexts 132 requesting access to the host or local memory table 144, it should be noted that the present disclosure contemplates requesting access to any suitable platform resource, including, but not limited to, a local memory, a network component, a storage component, etc.

Figure 2:
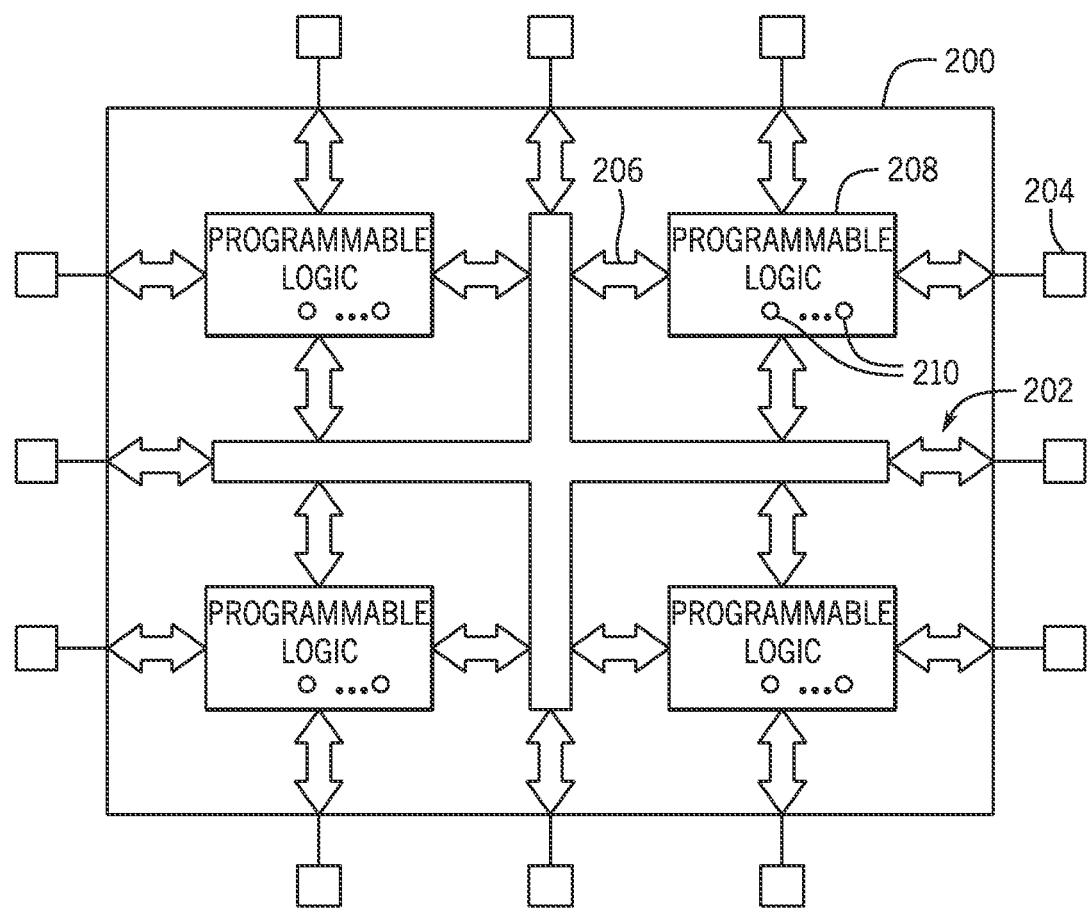
FIG. 2 is a block diagram of an integrated circuit that may isolate misbehaving programmable logic may be implemented, in accordance with an embodiment of the present disclosure.

Turning now to a more detailed discussion of the accelerator circuit 104, FIG. 2 illustrates the accelerator circuit 104 as a programmable logic device, such as a field-programmable gate array (FPGA) 200, according to an embodiment of the present disclosure. For the purposes of this example, the device is referred to as the FPGA 200, though it should be understood that the device may be any type of programmable logic device (e.g., an application-specific integrated circuit, application-specific standard product). As shown, the FPGA 200 may have input/output circuitry 202 for driving signals and the like from the FPGA 200 and for receiving signals from other devices via input/output pins 204. Interconnection resources 206, such as global and local vertical and horizontal conductive lines and buses, may be used to route signals on the FPGA 200. Additionally, the interconnection resources 206 may include fixed interconnects (e.g., conductive lines) and programmable interconnects (e.g., programmable connections between respective fixed interconnects). Programmable logic 208 may include programmable elements 210, such as combinational and sequential logic circuitry. For example, the programmable logic 208 may include look-up tables, registers, and multiplexers. In various embodiments, the programmable logic 208 may perform custom logic functions. In some embodiments, the programmable interconnects may be part of the programmable logic 208.

As discussed above, a designer (e.g., a customer) may program (e.g., configure) the programmable logic 208 to perform one or more desired functions. By way of example, some programmable logic devices 200 may be programmed by configuring their programmable elements 210 using mask programming arrangements, which may be performed during semiconductor manufacturing. Other programmable logic devices 200 may be configured after semiconductor fabrication operations have been completed, such as by using electrical programming or laser programming to program their programmable elements 210. In general, the programmable elements 210 may be based on any suitable programmable technology, such as fuses, antifuses, electrically-programmable read-only-memory technology, random-access memory cells, mask-programmed elements, and so forth.

Most programmable logic devices 200 are electrically programmed. With electrical programming arrangements, the programmable elements 210 may be formed from one or more memory cells. For example, during programming, configuration data may be loaded into the memory cells using input/output pins 204 and input/output circuitry 202. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 208. For instance, in some embodiments, the output signals may be applied to the gates of metal-oxide-semiconductor (MOS) transistors within the programmable logic 208.

The logic of the FPGA 200 may be organized using any suitable architecture. As an example, the circuitry of the FPGA 200 may be organized in a series of rows and columns of larger programmable logic regions, each of which may contain multiple smaller logic regions. The logic resources of the FPGA 200 may be interconnected by the interconnection resources 206 such as associated vertical and horizontal conductors. For example, in some embodiments, these conductors may include global conductive lines that span substantially all of the FPGA 200, fractional lines such as half-lines or quarter lines that span part of the FPGA 200, staggered lines of a particular length (e.g., sufficient to interconnect several logic areas), smaller local lines, or any other suitable interconnection resource arrangement. Moreover, in further embodiments, the logic of the FPGA 200 may be arranged in more levels or layers in which multiple large regions are interconnected to form still larger portions of logic. Still further, other device arrangements may use logic that is not arranged in a manner other than rows and columns.

In some instances, it may be desirable to partially reconfigure certain portions of the FPGA 200. That is, the FPGA 200 may include adaptable logic that enables partial reconfiguration, such that a portion of the functionality of the FPGA 200 may be modified (e.g., enabling functionality to be added, removed, and/or swapped) during its runtime.

As previously discussed, multiple regions (e.g., the first region 150 and the second region 152) may utilize the AFC host interface 146. In one example, the first region logic 114 may be configured with a first-party image (e.g., an image provided by an integrated circuit manufacturer or user/consumer), while the second region logic 154 may be configured with a third-party image (e.g., an image provided by a software/hardware manufacturer) that may be incompatible. That is, the accelerated function units 126 and/or accelerated function contexts 132 configured with the third-party image may send request(s) (e.g., data packet(s) (host memory or interrupts)) to the AFC Host Interface 146 to access the first region 150 configured with a first-party image and these request(s) may not be in compliance. Noncompliance may result when the request(s) are in an unexpected format (e.g., an incompatible format of packets) or appear to make a request that the accelerated function units 126 and/or accelerated function contexts 132 are not authorized to do. The accelerated function units 126 and/or accelerated function contexts 132 that are the source of these incompatible request(s) may be referred to as "misbehaving." Because the misbehavior of the accelerated function units 126 and/or accelerated function contexts 132 might negatively impact the operation of the FPGA 200, the overall system 100, or systems connected to the system 100, the misbehaving accelerated function units 126 and/or accelerated function contexts 132 may be identified and isolated to mitigate a potential negative impact of the misbehavior.

Figure 3:
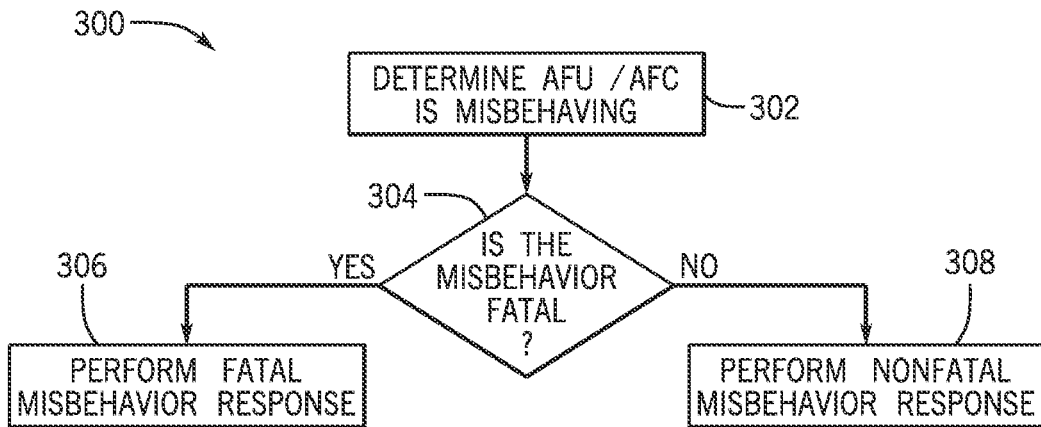
FIG. 3 is a flow diagram illustrating a method for addressing a misbehaving accelerated function unit or accelerated function context in the integrated circuit device, in accordance with an embodiment of the present disclosure.

To help illustrate, an example of process 300 for detecting a misbehaving accelerated function units 126 and/or accelerated function contexts 132 in the FPGA 200 with both the first region 150 and the second region 152 communicating via a compatible logical protocol interface is shown in FIG. 3, in accordance with an embodiment of the present disclosure. For the purposes of this example, the logical protocol interface may be data packet(s), which includes CCI-P (Core Cache Interface), though it should be understood that the FPGA 200 may utilize other logical protocol interfaces as discussed previously. Generally, the process 300 includes the first region logic 114 (e.g., first region configured with a first-party image) and/or host software 156 determining that an accelerated function unit (e.g., AFU A 126, AFU B 128, AFU X 130) or accelerated function context (e.g., AFC A0 132, AFC B0 134, AFC X0 136) configured with a third-party second region logic 154 is misbehaving (e.g., not in compliance with expected behavior) (process block 302), determining whether the misbehavior is fatal (decision block 304), and then performing fatal misbehavior responses when the misbehavior is fatal (process block 306) or nonfatal misbehavior responses when the misbehavior is nonfatal (process block 308). In some embodiments, the process 300 may be implemented at least in part by executing instructions stored in a tangible, non-transitory, computer-readable medium, such as the processor memory 110, using processing circuitry, such as the processor 102.

Figure 4:
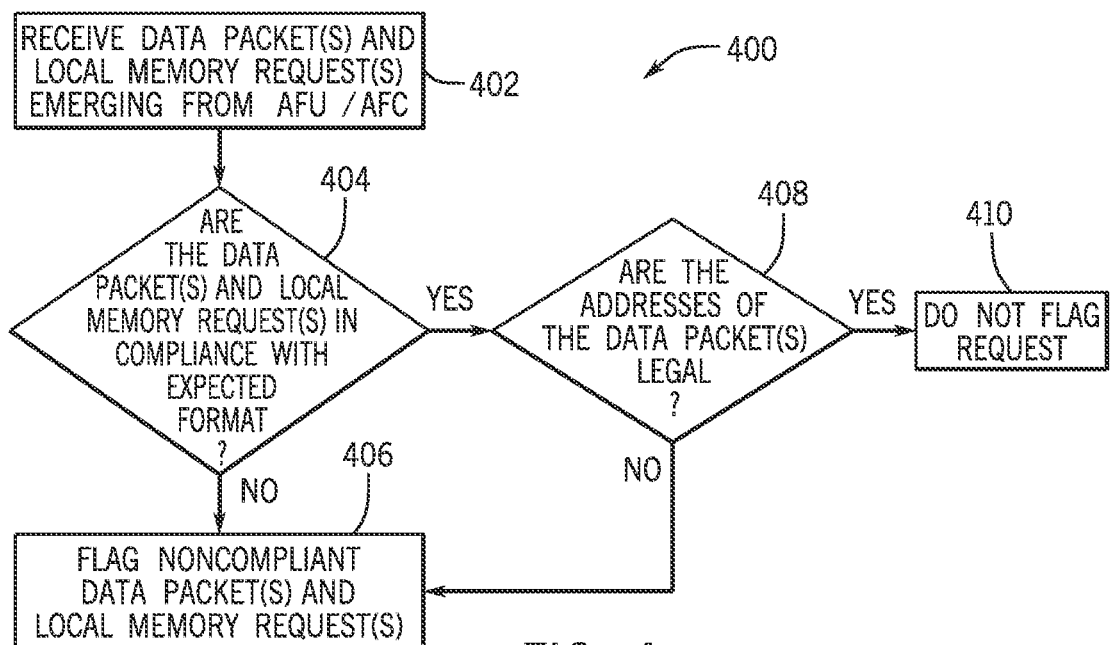
FIG. 4 is a flow diagram of a method that may determine a misbehavior in a specific accelerated function unit or accelerated function context, in accordance with an embodiment of the present disclosure.

As illustrated, the first region logic 114 and/or host software 156 may determine a misbehaving accelerated function unit 126 and/or accelerated function context 132 (process block 302). This determination may be performed as described in FIG. 4, in accordance with an embodiment of the present disclosure. In particular, FIG. 4 is a flow chart of a process 400 for a first-party first region logic 114 and/or host software 156 checking data packet(s) and local memory request(s) emerging from an accelerated function unit 126 and/or accelerated function contexts 132 (process block 402), determining whether the data packet(s) and the local memory request(s) are in compliance (e.g., are legal, compatible) with the expected format (decision block 404), determining whether the address(es) of the data packet(s) are legal when the data packet(s) and the local memory request(s) are in compliance with the expected format (decision block 408), and not flagging the data packet(s) and the local memory request(s) when the address(es) of the packet(s) sent are legal (process block 410). The second region logic 154 may send request(s) to the first region logic 114 in the form of data packet(s) and local memory request(s). A local memory request from the second region logic 154 may instruct the first region logic 114 to access accelerator circuit memory 148 via the local memory table 144. When the data packet(s) or local memory request(s) are not in compliance with expected format, or are compliant with expected format but the address(es) of the packet(s) sent are not in compliance, the process 400 includes flagging the noncompliant request to be categorized into a class of fatal or nonfatal misbehaving accelerated function unit 126 or accelerated function context 132 (process block 406). While the present disclosure checks data packet(s) and local memory request(s), it should be understood that the disclosed techniques may check the data packet(s) without checking the local memory request(s), or the local memory request(s) without checking the data packet(s). In some embodiments, the process 400 may be implemented at least in part by executing instructions stored in a tangible, non-transitory, computer-readable medium, such as the processor memory 110, using processing circuitry, such as the processor 102.

As described, the first region logic 114 and/or host software 156 may receive data packet(s) and local memory request(s) emerging from an accelerated function unit 126 and/or accelerated function contexts 136 (process block 402). The first region logic 114 and/or host software 156 may then determine whether the address(es) of the data packet(s) sent are legal (decision block 408). The detection may be possible because the second region 152, which contains the accelerated function units 126 and the accelerated function contexts 132, is bounded by the first region 150 that is configured with first region logic 114. The first region logic 114 includes error detection and mitigation logic 140 that checks and determines interface protocol compliance, such as compliance with data packet(s) (e.g., CCI-P). For example, the error detection and mitigation logic 140 may determine protocol compliance by checking whether data packet(s) transaction(s) originating in the accelerated function unit 126 or accelerated function context 132 are compliant with data packet(s) specifications, or checking whether data packet(s) requested are not formatted in the expected structure.

If the first region logic 114 and/or host software 156 determines that the data packet(s) are compliant (e.g., legal, compatible, or the like) via the error detection and mitigation logic 140, then the first region logic 114 may not flag the request (process block 410). That is, the error detection and mitigation logic 140 may not flag data packet(s) that are in compliance with the expected format and have packet address(es) that are legal. For example, request(s) from the second region 152 that are compliant with expected data packet(s) transaction(s) and compatible to communicate with the first region logic 114, the host (e.g., processor 102), and local memory table 144 (e.g., accelerator circuit memory 148) may not be flagged by the first region logic 114.

When the data packet(s) or local memory request(s) are not in the expected format, or are in the expected format but the address(es) of the packet(s) are not legal, the first region logic 114 or the host software 156 may flag the source of the noncompliant request(s) as misbehaving (process block 406). In this manner, the first region logic 114 and/or host software 156 may determine whether the accelerated function units 126 and/or accelerated function contexts 132 are misbehaving (e.g., unreliable) and should be identified and isolated.

Returning to the process 300 of FIG. 3, after the first region logic 114 and/or host software 156 has detected and flagged an accelerated function unit 126 and/or accelerated function context 132 as misbehaving (e.g., noncompliant, incompatible), the first region logic 114 and/or host software 156 may determine whether the misbehavior is fatal (decision block 304). The first region logic 114 and/or host software 156 may take a series of responses depending on whether the misbehavior was fatal or nonfatal, and whether the misbehavior occurred in an accelerated function unit 126 or an accelerated function context 132.

In some embodiments, determining whether the misbehavior is fatal or nonfatal includes first determining an identity of the misbehaving accelerated function unit 126 or accelerated function context 132. As previously described, the first region logic 114 and/or host software 156 may determine that data packet(s) or local memory request(s) from the second region 152 are incompatible, and flag the incompatible request(s). As such, the flagged incompatible request(s) may provide an indication of the misbehavior to the first region logic 114 and/or host software 156. Since the accelerated function units 126 and accelerated function contexts 132 are contained in the second region 152, which is further contained within the first region 150, the second region 152 boundary may be controlled by the first region logic 114. Therefore, the first region logic 114 may be able to detect and mitigate, via the error detection and mitigation logic 140, a misbehaving accelerated function unit 126 and/or accelerated function context 132 occurrence at its boundary and take appropriate action. Similarly, the host system (e.g., processor 102) may detect and mitigate, through the host software 156, the misbehaving accelerated function unit 126 and or accelerated function context 132 occurrence and respond accordingly.

Determining incompatibility of configurations between the first region logic 114 and second region logic 154 due to misbehaving accelerated function units 126 and/or accelerated function contexts 132 involves identification using an AFC Host Interface 146 value and AFC-AHI Table 142. As previously described, the accelerated function units 126 and/or accelerated function contexts 132 contained within the second region 152 may be identified as an FPGA 104 slot identification value to the AFC-AHI Table 142 in the first region 150, which may be accessed by the AFC Host Interface 146. The AFC-AHI Table 142 translates the FPGA 104 slot identification value of a particular accelerated function unit 126 and/or accelerated function context 132 to a unique AHI value that is used by the AFC Host Interface 146. The AFC Host Interface 146 may then communicate the AHI values to the first region logic 114 and/or host software 156. Thus, the first region logic 114 and/or host software 156 may use the AHI value communicated by the AFC Host Interface 146 to identify the misbehaving accelerated function unit 126 or accelerated function context 132. Once the misbehaving accelerated function unit 126 or accelerated function context 132 has been identified, the first region logic 114 and/or host software 156 may automatically respond based on the class of the misbehavior (e.g., fatal or nonfatal).

The first region logic 114 and/or host software 156 may determine that the misbehavior exhibited by an misbehaving accelerated function unit 126 is fatal when, for example, the accelerated function unit 126 exceeds a thermal threshold, a physical function (PF) of the accelerated function unit 126 fails to respond to a memory mapped input/output (MMIO) read request, a PF request of the accelerated function unit 126 is incorrectly formatted, and the like. The first region logic 114 and/or host software 156 may determine that the misbehavior exhibited by a misbehaving accelerated function context 132 is fatal when, for example, the accelerated function context 132 does not respond to a MMIO read request, the data packet(s) or local memory request(s) of the accelerated function context 132 are incorrectly formatted, and the like.

Alternatively, the first region logic 114 and/or host software 156 may determine that the misbehavior exhibited by a misbehaving accelerated function unit 126 is nonfatal when, for example, a PF context of the misbehaving accelerated function unit 126 accesses a protected memory address range, and the like. The first region logic 114 and/or host software 156 may determine that the misbehavior exhibited by an misbehaving accelerated function context 132 is nonfatal when, for example, the accelerated function context 132 accesses unmapped host memory or an unauthorized location, accesses local memory outside an allowed range, generates an abnormally high rate of data packets (host memory accesses or interrupts), and the like.

When the first region logic 114 and/or host software 156 determine that the misbehavior is fatal (decision block 304), the first region logic 114 and/or host software 156 may perform a fatal misbehavior response (process block 306). In particular, when the misbehavior is determined to be fatal and is identified as originating in an accelerated function unit 126, the first region logic 114 and/or host software 156 may respond by: resetting the accelerated function unit 126, applying clock-gating to areas of the FPGA 200 that contain the accelerated function unit 126 to reduce power usage, removing power to the accelerated function unit 126, and/or reprograming with a NULL accelerated function unit 126.

When the fatal misbehavior is determined to be originating in an accelerated function context 132, then the first region logic 114 and/or host software 156 may respond by: isolating and/or resetting the accelerated function context 132.

On the other hand, when the first region logic 114 and/or host software 156 determine that the misbehavior is nonfatal (decision block 304), the first region logic 114 and/or host software 156 may perform a nonfatal misbehavior response (process block 308). When the nonfatal misbehavior is identified to originate in an accelerated function unit 126, the first region logic 114 and/or host software 156 respond by: resetting the accelerated function unit 126 without completely erasing the current logic, isolating the accelerated function unit 126 by updating the AFC-AHI Table 142 and local memory table 144, and/or sending an error response in response to the specific request without affecting other transactions.

When the nonfatal error is identified as to originate in an accelerated function context 132, the first region logic 114 and/or host software 156 may respond by: resetting the misbehaving accelerated function context 132 without completely erasing the current logic, isolating the accelerated function context 132 by updating the AFC-AHI Table 142 or local memory table 144, or sending an error response in response to the specific request.

In some embodiments, the actions may be implemented at least in part by executing instructions stored in a tangible, non-transitory, computer-readable medium, such as the processor memory 110, using processing circuitry, such as the processor 102. The first region logic 114 and/or host software 156 may take one or more of the actions listed depending on the preconfigured design goals and target environment of the first region logic 114 and/or host software 156. The configuration may be predetermined and stored in a tangible, non-transitory, computer-readable medium, such as processor memory 110.

Thus, one or more of the disclosed embodiments, alone or in combination, may provide one or more technical effects including improving performance of an FPGA with a first region 150 and a second region 152. In particular, the disclosed embodiments may determine an incompatible (e.g., noncompliant) request originating from an accelerated function unit 126 and/or accelerated function context 132 and automatically isolate the misbehaving (e.g., incompatible) accelerated function unit 126 and/or accelerated function context 132 for further action depending on the level of incompatibility (e.g., fatal versus nonfatal). For instance, a first region logic 114 may be configured with a first-party image while a second region logic 154 that contains the accelerated function unit 126 and/or accelerated function context 132 may be configured with a third-party image. Since the configurations are from different parties, the request(s) coming from the second region 152 sent to the first region 150 may be incompatible and may be automatically isolated by the first region logic 114 and/or host software 156. In this manner, the techniques described herein enable preventing unreliable accelerated function unit(s) 126 and/or accelerated function context(s) 132 from affecting the FPGA 104, processor, or the overall data center system 100. The technical effects and technical problems in the specification are exemplary and are not limiting. It should be noted that the embodiments described in the specification may have other technical effects and can solve other technical problems.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The invention claimed is:

1. An integrated circuit device comprising:
   a user partition of programmable logic circuitry reconfigurable during runtime with a user-defined accelerator; and a static partition of programmable logic circuitry not to be reconfigured during runtime, wherein the static partition is to isolate the user-defined accelerator in response to identifying a protocol violation in a communication of the user-defined accelerator.

2. The integrated circuit device of claim 1, wherein the protocol comprises an Advanced Extensible Interface (AXI) protocol.

3. The integrated circuit device of claim 1, wherein the user-defined accelerator communicates via a physical function.

4. The integrated circuit device of claim 1, wherein the protocol violation in the communication comprises an incorrectly formatted communication.

5. The integrated circuit device of claim 4, wherein the communication comprises a physical function (PF) request.

6. The integrated circuit device of claim 1, wherein the protocol violation in the communication comprises an incorrectly formatted data packet.

7. The integrated circuit device of claim 1, wherein the protocol violation in the communication comprises a lack of response by the user-defined accelerator to a read request.

8. An article of manufacture comprising one or more tangible, non-transitory machine-readable media comprising instructions that, when executed by a data processing system, cause the data processing system to generate a programmable logic device system design comprising:
an accelerator to be configured in a reconfigurable region of the programmable logic device to be reconfigurable during runtime; and
error detection and mitigation logic to be configured in a static region of the programmable logic device not to be reconfigurable during runtime, wherein the error detection and mitigation logic is to check compliance of a logical protocol interface transaction of the accelerator.

9. The article of manufacture of claim 8, wherein the error detection and mitigation logic is to check compliance of the logical protocol interface transaction, wherein the logical protocol interface transaction originates from the accelerator.

10. The article of manufacture of claim 8, wherein the error detection and mitigation logic is to check compliance with an Advanced Extensible Interface (AXI) protocol of the logical protocol interface transaction.

11. The article of manufacture of claim 8, wherein the error detection and mitigation logic is to isolate the accelerator based on noncompliance of the logical protocol interface transaction.

12. The article of manufacture of claim 11, wherein noncompliance of the logical protocol interface transaction comprises a data packet that is incorrectly formatted.

13. The article of manufacture of claim 8, wherein noncompliance of the logical protocol interface transaction comprises a failure to respond to a request.

14. The article of manufacture of claim 8, wherein all communication by the accelerator passes through the static region of the programmable logic device.

15. The article of manufacture of claim 14, wherein all communication by the accelerator is subject to the error detection and mitigation logic.

16. An integrated circuit device comprising:
a reconfigurable region of programmable logic circuitry configurable during runtime to be programmed with a user-defined accelerator; and
a static region of programmable logic circuitry not to be reconfigured during runtime, wherein the static region is to mitigate misbehavior by the user-defined accelerator, wherein the misbehavior comprises noncompliant communication.

17. The integrated circuit device of claim 16, wherein the noncompliant communication comprises a protocol-noncompliant communication.

18. The integrated circuit device of claim 17, wherein the protocol-noncompliant communication comprises Advanced Extensible Interface (AXI)-noncompliant communication.

19. The integrated circuit of claim 16, wherein the noncompliant communication comprises a failure to respond to a request.

20. The integrated circuit of claim 19, wherein the request comprises a memory-mapped input/output (MMIO) read request.

* * * * *